United States Patent [19]

Hotta

[11] Patent Number: 5,148,063
[45] Date of Patent: Sep. 15, 1992

[54] SENSE AMPLIFIER CIRCUIT USING DUMMY MEMORY CELLS

[75] Inventor: Yasuhiro Hotta, Nara, Japan

[73] Assignee: Sharp Kabushiki Kaisha, Osaka, Japan

[21] Appl. No.: 658,039

[22] Filed: Feb. 20, 1991

[30] Foreign Application Priority Data

Feb. 21, 1990 [JP] Japan .................................. 2-40082

[51] Int. Cl.$^5$ .............................................. G11C 7/00
[52] U.S. Cl. .................................. 307/530; 365/208; 365/210
[58] Field of Search ................. 307/530; 365/207, 208, 365/210

[56] References Cited

U.S. PATENT DOCUMENTS 4,604,732 8/1986 Van Tran ....................... 307/530 X

OTHER PUBLICATIONS

Electronics, Information and Communication Institute, "High Speed Design Concept for Mask ROM", 1990.
The 1990 Symposium on VLSI Circuits, "A 36 ns 1Mbit CMOS EPROM with new data sensing technique," 1990.

Primary Examiner—James B. Mullins

[57] ABSTRACT

A sense amplifier detects if a logic state of a detected memory cell transistor is "1" or "0" via a data line connected to the detected memory cell transistor. The sense amplifier includes a first dummy memory cell transistor which has characteristics identical to the "1" logic state characteristics of the detected memory cell transistor, a second dummy memory cell transistor which has characteristics identical to the "0" logic state characteristics of the detected memory cell transistor, and a differential amplifier circuit. The differential amplifier circuit receives signals from the data line and first and second reference lines respectively connected to the first and second dummy memory cell transistors, as a differential input, and outputs either a high or a low level according to the logic state of the detected memory cell based on the potential of the first or second reference line, the potential selected being that which differs from the potential of the data line.

2 Claims, 4 Drawing Sheets

SENSE AMPLIFIER CIRCUIT USING DUMMY MEMORY CELLS

BACKGROUND OF THE INVENTION

The present invention relates to a sense amplifier circuit for a semiconductor memory device.

Shown in FIG. 4 is one type of a conventional sense amplifier circuit as applied to a semiconductor memory, for example, a mask ROM (read-only memory). This sense amplifier circuit includes a current mirror type differential amplifier circuit 10, a reference line REF connected to a power supply through a pMOS (p-channel metal oxide semiconductor) transistor Qp2, an on-state n-MOS transistor Qn5, a dummy bit line DBL connected to the reference line REF through the nMOS transistor Qn5, and dummy memory cell transistors Qn2 and Qn3 serially connected between the dummy bit line DBL and ground. Symmetrical to the reference line REF side are a data line DL connected to the power supply through a pMOS transistor Qp1, an nMOS transistor Qn4 which is switched by a column selection signal Cse1, and a bit line BL connected to the data line DL through the nMOS transistor Qn4. Multiple nMOS detected memory cell transistors Qn1 (only one transistor is shown in the figure for simplicity) are connected between the bit line BL and the ground.

The current mirror type differential amplifier circuit 10 includes a pair of pMOS transistors Qp3 and Qp4 connected to the power supply and having identical characteristics, a pair of nMOS transistors Qn6 and Qn7 serially connected to the Qp3 and Qp4 transistors, respectively, and likewise having identical characteristics, and an nMOS transistor Qn8 connected between the ground and the contacts of the transistors Qn6 and Qn7. The gates of the nMOS transistors Qn6 and Qn7 are connected, respectively, to the reference line REF and the data line DL. The detected memory cell transistor Qn1 is turned ON when a voltage is applied to the gate over the word line WL when in a logic state of "1", i.e., a low threshold value, as occurs with a normal enhancement transistor, and is in an OFF state in which virtually no current passes when in a "0" logic state, i.e., a high threshold value state. The nMOS dummy memory cell transistors Qn2 and Qn3 both have the same characteristics as the detected memory cell transistor Qn1 when in a "1" logic state.

The charge current which flows to the reference line REF from the power supply (potential Vcc) through the pMOS transistor Qp2 decreases as the potential Vref (hereinafter after the reference potential) of the reference line REF increases as shown by the dotted line 13 in FIG. 3. On the other hand, the discharge current which flows to the ground through the dummy memory cell transistors Qn2 and Qn3 from the reference line REF increases as the reference potential Vref increases as shown by the dot-dash line 14 in the same figure. Therefore, the reference potential Vref is determined by the balance between the discharge and charge currents mentioned above, becoming the potential Vc expressed by the intersection C of the dotted line 13 and the dot-dash line 14.

Furthermore, the charge current flowing from the power supply through the pMOS transistor Qp1 to the data line DL similarly decreases as the potential Vd1 (hereinafter the data line potential) of the data line DL increases as shown by the dotted line 13 in FIG. 3. When the detected memory cell transistor Qn1 is in a "1" logic state and the data line potential Vd1 rises, the discharge current discharged to the ground from the data line DL increases as indicated by the solid line 11. When the detected memory cell transistor Qn1 is in a "0" logic state, the discharge current remains flat at approximately zero as indicated by solid line 12 regardless of the value of the data line potential Vd1. Note that the discharge current 14 of the reference line REF becomes approximately one-half of the discharge current 11 of the data line DL due to the serial resistance of the dummy memory cell transistors Qn2 and Qn3.

When the logic state of the detected memory cell transistor Qn1 is "1", the data line potential Vd1 becomes the potential Va (<Vc) indicated by the intersection A of the dotted line 13 and the solid line 11 due to the balance between the charge and discharge currents. Conversely, when the logic state of the memory cell transistor Qn1 is "0", the data line potential Vd1 becomes potential Vb (>Vc) expressed by the intersection B of the dotted line 13 and the solid line 12. When the logic state of the detected memory cell transistor Qn1 is "1", the current mirror type differential amplifier circuit 10 receives the reference potential Vref=Vc and the data line potential Vd1=Va at the gates of the nMOS transistor Qn6 and Qn7, respectively, differentially amplifies the potentials, and sets the potential Vsa to a high level for output based on this potential difference. When the logic state of the detected memory cell transistor Qn1 is "0", the current mirror type differential amplifier circuit 10 receives the reference potential Vref=Vc and the data line potential Vd1=Vb at the gates of the nMOS transistor Qn6 and Qn7, respectively, differentially amplifies the potentials, and sets the potential Vsa to a low level for output. The logic state of the detected memory cell transistor Qn1 is thus detected.

The detected memory cell transistor Qn1 is designed so that the discharge current of the data line DL is approximately zero as shown by the solid line 12 in FIG. 3, when the logic state of the detected memory cell transistor Qn1 is "0". Due to variations introduced during manufacture, however, discharge currents which are too high to be ignored occasionally flow. This causes the value of the data line potential Vd1 to drop to a value less than the potential Vb, resulting in a difference with the reference potential Vref less than the design value ((Vb-Va)/2). As a result, a conventional sense amplifier circuit has nominal operational tolerance and presents stability problems. In extreme cases, an operating error occurs where the voltage relation becomes Vd1<Vref (=Vc) though the logic state of the detected memory cell transistor Qn1 is "0".

In addition, the same problem occurs in the case of an EPROM or EEPROM sense amplifier circuit due to deterioration of the "0" state characteristics of the detected memory cell transistor accompanying rewriting of the detected memory cell.

SUMMARY OF THE INVENTION

Therefore, an object of the present invention is to provide a sense amplifier circuit which can stably sense amplify without operating errors occurring even if the current characteristics of the "0" state in a detected memory cell transistor deteriorate due to variations in manufacture or rewriting.

To achieve this object, a sense amplifier circuit according to the present invention detects whether a logic state of a detected memory cell including a transistor is "1" or "0" via a data line connected to the transistor. The sense amplifier circuit comprising:

a first dummy memory cell including a first transistor which has characteristics identical to the "1" logic state characteristics of the detected memory cell;

a second dummy memory cell including a second transistor which has characteristics identical to the "0" logic state characteristics of the detected memory cell;

a first reference line which is connected to the first dummy memory cell and to which is applied a reference potential of a level corresponding to the characteristics of the first transistor of the first dummy memory cell;

a second reference line which is connected to the second dummy memory cell and to which is applied a reference potential of a level corresponding to the characteristics of the second transistor of the second dummy memory cell; and a differential amplifier circuit which receives signals from the data line connected to the detected memory cell and the first and second reference lines as a differential input, and outputs either a high level or a low level according to the logic state of the detected memory cell based on the potential of the first or second reference line, the potential selected being that which differs from the potential of the data line.

The differential amplifier circuit operates based on the potential of a low level first reference line or a high level second reference line, the line potential used being that which differs from the potential of the data line. For example, when the logic state of the detected memory cell transistor is "1", and the data line potential is therefore low, the differential amplifier operates with an input equal to the difference between the high level second reference potential and the low level data line potential based on the potential of the high level second reference line (the second reference potential). Conversely, when the logic state of the detected memory cell transistor is "0", and the data line potential is therefore high, the differential amplifier operates with an input equal to the difference between the low level first reference potential and the high level data line potential based on the potential of the low level first reference line (the first reference potential).

Thus, the difference between the reference potential and the data line potential is the difference between high and low level potentials whether the data line potential is high or low. In other words, the potential difference of the input to the differential amplifier circuit is approximately twice the design potential difference of a conventional device, and the operating tolerance of the differential amplifier circuit is therefore increased.

Depending upon variations introduced during manufacture and other factors, if a discharge current on the data line occurs when the detected memory cell transistor is in a "0" state, the data line potential drops. Because the second dummy memory cell transistor has the same characteristics as the "0" state of the detected memory cell transistor at this time, the second reference potential drops by an amount equal to the drop in the data line potential. Thus, the difference between the first reference potential and the second reference potential decreases, and the potential difference input to the differential amplifier circuit decreases. However, because the design value of the difference between the first and second reference potentials is approximately twice that of a conventional device, even if this potential difference becomes in extreme cases half the design value, the potential difference will still be roughly equivalent to the design value of a conventional device and the differential amplifier circuit will function normally. As a result, sense amplification is more stable when compared with that of a conventional device.

BRIEF DESCRIPTION OF THE DRAWINGS

The present invention will become more fully understood from the detailed description given below and the accompanying drawings which are given by way of illustration only, and thus are not limitative of the present invention, and wherein.

DESCRIPTION OF PREFERRED EMBODIMENTS

The preferred embodiments of the present invention are described hereinbelow with reference to the accompanying figures. It shall be noted that the following description relates specifically to a sense amplifier circuit in a mask ROM by way of example only.

Figure 1:
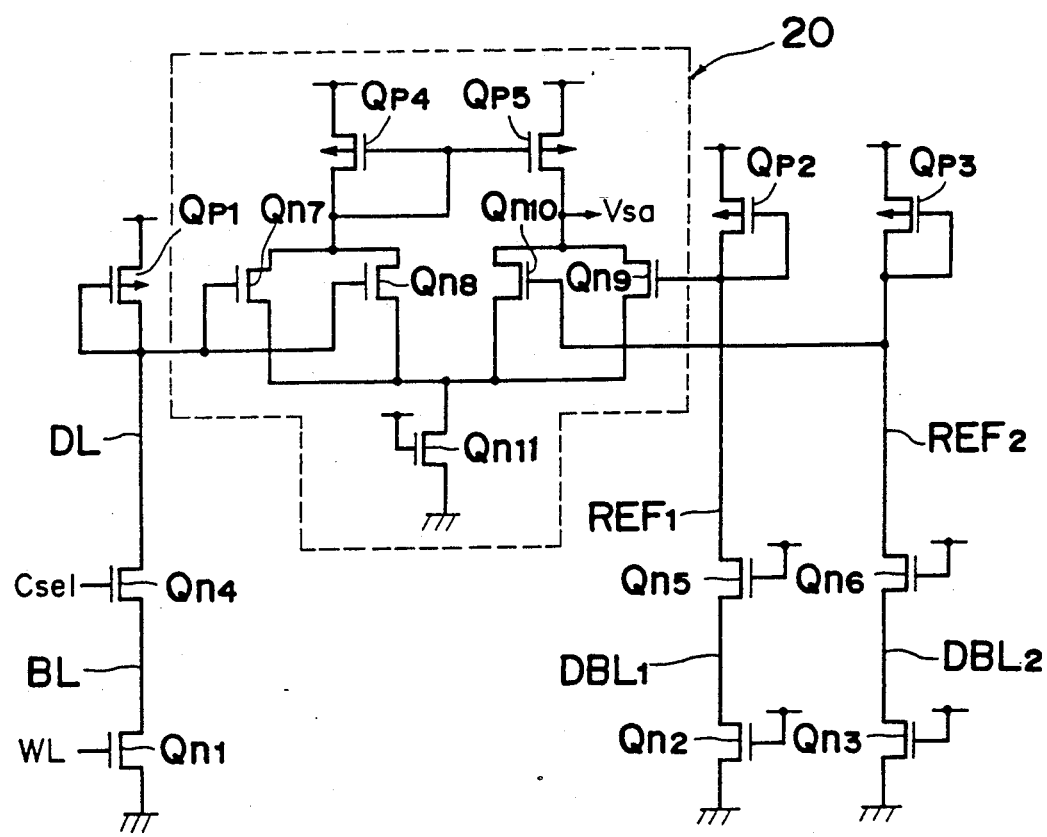
FIG. 1 is a circuit diagram of a sense amplifier circuit according to a preferred embodiment of the present invention.

As shown in FIG. 1, this sense amplifier circuit includes a current mirror type differential amplifier circuit 20, a data line DL connected to a power supply through a pMOS transistor Qp1, an nMOS transistor Qn4 which is switched by a column selection signal Cse1, and a bit line BL connected to the data line DL through the nMOS transistor Qn4. Multiple nMOS detected memory cell transistors Qn1 (only one transistor is shown in the figure for simplicity) are connected in parallel between the bit line BL and the ground.

The sense amplifier circuit includes a first reference line REF1 and a second reference line REF2, each connected to the power supply through pMOS transistors Qp2 and Qp3, respectively; ON-state nMOS transistors Qn5 and Qn6; a first dummy bit line DBL1 and a second dummy bit line DBL2 connected, respectively, to the first and second reference lines REF1 and REF2 through the nMOS transistors Qn5 and Qn6; and dummy memory cell transistors Qn2 and Qn3 connected between the ground and the first and second dummy bit lines DBL1 and DBL2, respectively.

The current mirror type differential amplifier circuit 20 includes a pair of pMOS transistors Qp4 and Qp5 connected to the power supply, two pairs of nMOS transistors Qn7, Qn8 and Qn9, Qn10, one pair each connected respectively to the transistors Qp4 and Qp5, and an nMOS transistor Qn11 connected between the ground and the contacts of the nMOS transistors Qn7, Qn8 and Qn9, Qn10. Each of the nMOS transistors Qn7, Qn8, Qn9, and Qn10 have identical characteristics.

The gates of the nMOS transistors Qn7 and Qn8 are connected to the data line DL, and the gates of the nMOS transistors Qn9 and Qn10 are respectively connected to the first and second reference lines REF1 and REF2. The detected memory cell transistor Qn1 is turned ON when a voltage is applied to the gate over the word line WL when in a logic state of "1", i.e., a low threshold value, as occurs with a normal enhancement transistor, and is in an OFF state in which virtually no current passes when in a "0" logic state, i.e., a high threshold value state. The nMOS dummy memory cell transistors Qn2 and Qn3 have the same characteristics as the detected memory cell transistor Qn1 when in "1" and "0" logic states, respectively. In addition, the pMOS transistors Qp1, Qp2 and Qp3 each have identical characteristics, and operate as the load of the transistors Qn1, Qn2, and Qn3.

Figure 2:
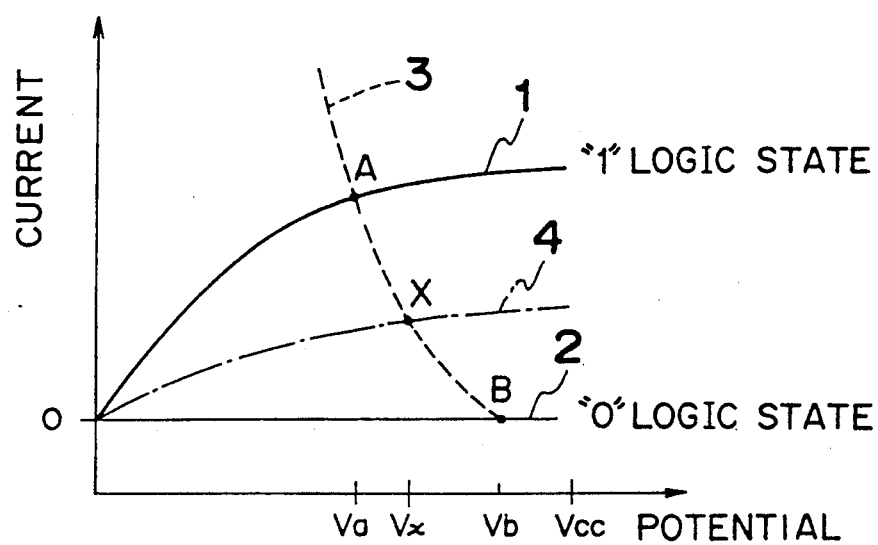
FIG. 2 is a graph showing the current-voltage characteristics of first and second reference lines and the data line of the above sense amplifier circuit.
Figure 3:
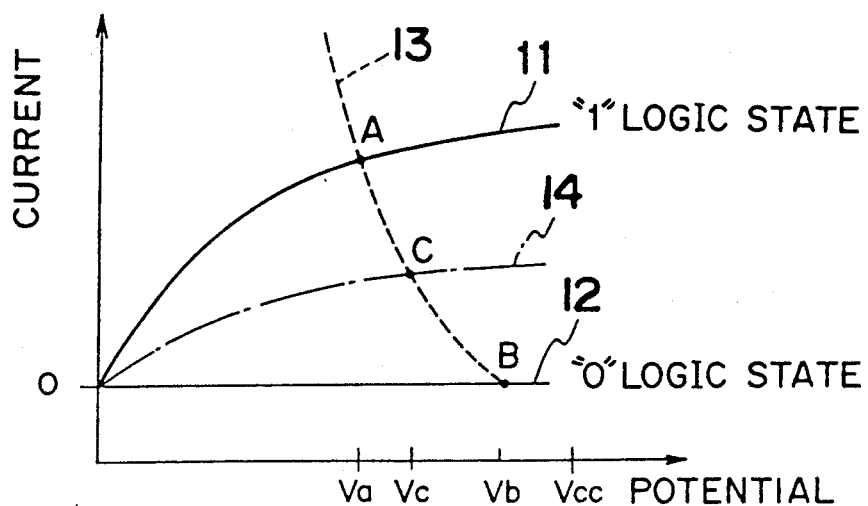
FIG. 3 is a graph showing the current-voltage characteristics of a reference line and the data line of a conventional sense amplifier circuit.
Figure 4:
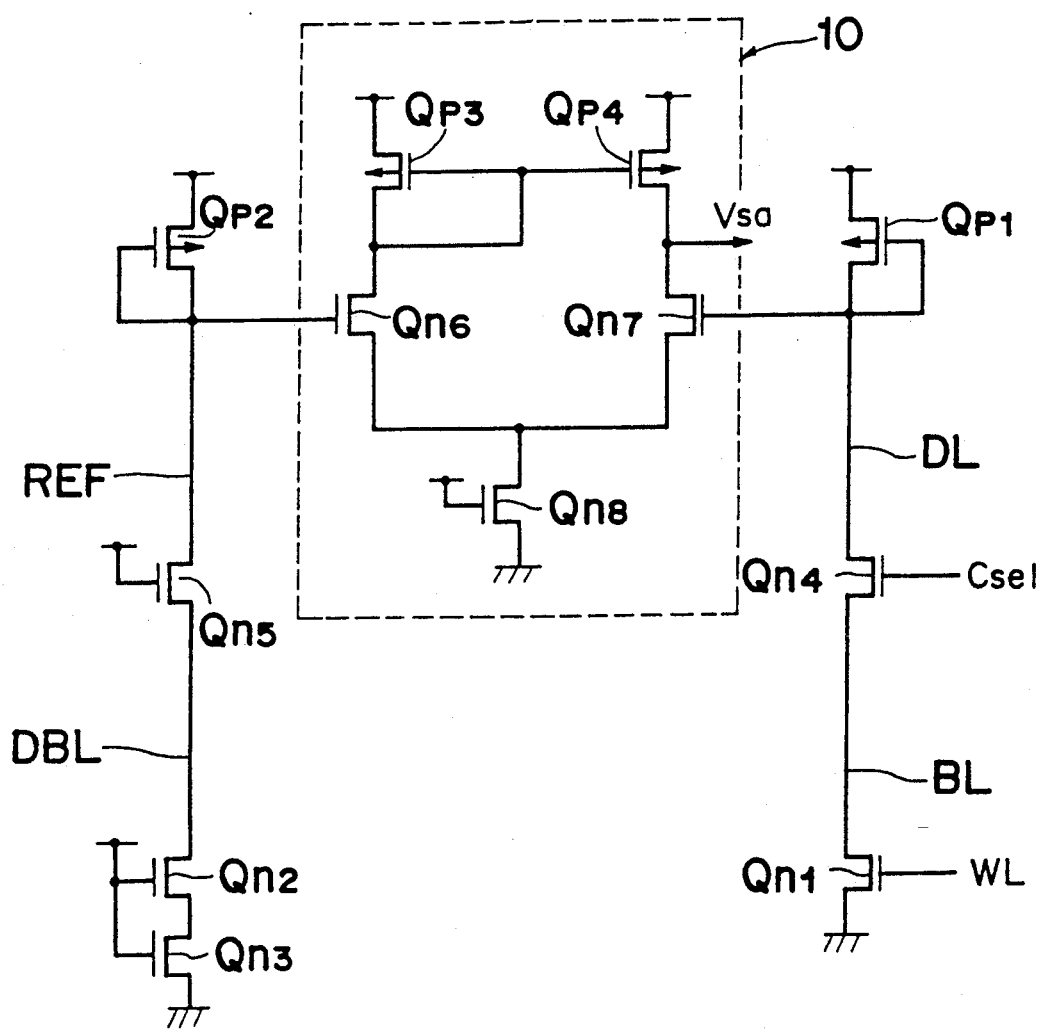
FIG. 4 is a circuit diagram of a conventional sense amplifier circuit.

The charge current flowing from the power supply (potential Vcc) through the pMOS transistor Qp1 to the data line DL decreases as the data line potential Vd1 increases as shown by the dotted line 3 in FIG. 2. When the detected memory cell transistor Qn1 is in a "1" logic state, the discharge current flowing to the ground from the data line DL increases as the data line potential Vd1 increases, as indicated by the solid line 1 in the same figure. Conversely, when the detected memory cell transistor Qn1 is in a "0" logic state, the discharge current remains flat at approximately zero as indicated by the solid line 2 regardless of the value of the data line potential Vd1. Therefore, the data line potential Vd1 is determined by the balance between the charge current and the discharge current as described above, and is the potential Va expressed by the intersection A of the dotted line 3 and the solid line 1 when the detected memory cell transistor Qn1 is in a "1" logic state. Conversely, the data line potential Vd1 is the potential Vb expressed by the intersection B of the dotted line 3 and the solid line 2 when the detected memory cell transistor Qn1 is in a "0" logic state.

Furthermore, the charge current flowing from the power supply to the first reference line REF1 and the second reference line REF2 through the pMOS transistors Qp2 and Qp3, respectively, decreases as the first and second reference potentials Vref1 and Vref2 increase as shown by the dotted line 3 in FIG. 2 similarly to the data line DL side. The discharge current flowing from the first reference line REF1 to the ground through the dummy memory cell transistor Qn2 in a "1" logic state as above increases as shown by the solid line 1 when the first reference potential Vref1 increases, and the discharge current flowing to the ground through the dummy memory cell transistor Qn3 in a "0" logic state as above from the second reference line REF2 remains flat at approximately zero regardless of the value of the second reference potential Vref2. Therefore, the first and second reference potentials Vref1 and Vref2 are potentials Va and Vb expressed by intersections A and B as determined by the balance between the charge current and discharge current.

The differential amplifier circuit 20 operates based on the potential of the first reference line REF1 of a low level Va or the second reference line REF2 of a high level Vb, the line potential selected being that which differs from the potential of the data line DL. For example, when the logic state of the detected memory cell transistor Qn1 is "1", and the data line potential Vd1 is therefore the low level Va, the currents flowing through transistors Qn7, Qn8, and Qn9 become the same amount because the first reference potential Vref1 is the low level Va. Because the second reference potential Vref2 is the high level Vb at this time, the current flowing through the transistor Qn10 is greater than that flowing through transistors Qn7, Qn8, and Qn9. Therefore, the differential amplifier circuit 20 outputs potential Vsa at a low level based on the second reference potential Vref2 of the high level Vb.

However, when the logic state of the detected memory cell transistor Qn1 is "0", and the data line potential Vd1 is therefore the high level Vb, the currents flowing through transistors Qn7, Qn8, and Qn10 become the same amount because the second reference potential Vref2 is the high level Vb. Because the first reference potential Vref1 is the low level Va at this time, the current flowing through the transistor Qn9 is less than that flowing through transistors Qn7, Qn8, and Qn10. Therefore, the differential amplifier circuit 20 outputs potential Vsa at a high level based on the first reference potential Vref1 of the low level Va.

Thus, the difference between the data line potential Vd1 and the reference potential Vref1 or Vref2 that is used as the base is the difference between the high level Vb and the low level Va whether the data line potential Vd1 is high or low. The design potential difference (Vb−Va) input to the differential amplifier circuit is approximately twice that of a conventional device, and the operating allowance of the differential amplifier circuit 20 is therefore increased.

Depending upon variations introduced during manufacture and other factors, if a discharge current on the data line occurs when the detected memory cell transistor Qn1 is in a "0" logic state, the data line potential Vd1 drops to less than Vb. Because the dummy memory cell transistor Qn3 has the same characteristics as the "0" state of the detected memory cell transistor Qn1 at this time, the second reference potential Vref2 drops by an amount equal to the drop in the data line potential Vd1. Thus, the difference between the first reference potential and the second reference potential (Vref2−−Vref1) decreases, and the potential difference input to the differential amplifier circuit 20 decreases. However, because the design difference (Vref2−Vref1) of the first and second reference potentials is (Vb−Va), even if this potential difference is halved, the potential difference will still be roughly equivalent to the design value of a conventional device and the differential amplifier circuit 20 will function normally. As a result, sense amplification is more stable when compared with that of a conventional device.

Figure 5:
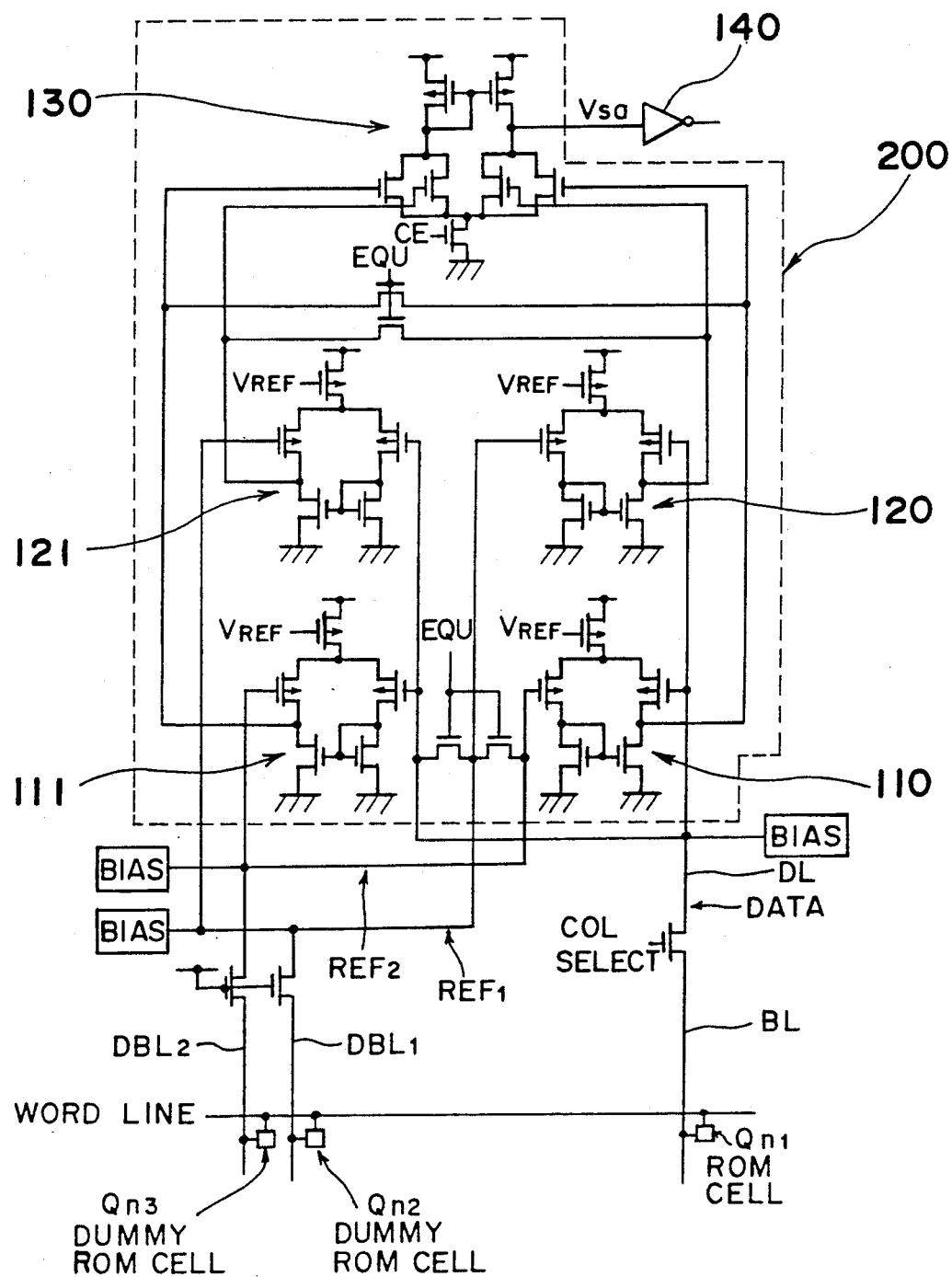
FIG. 5 is a circuit diagram of a sense amplifier circuit according to another embodiment of the present invention.

FIG. 5 is a circuit diagram showing another embodiment of the present invention. This embodiment is almost identical with the foregoing embodiment, except for differential amplifier circuits 20 and 200 shown in FIGS. 1 and 5. Therefore, elements which have the same function as that in FIG. 1 are designated by the same reference numerals as those in FIG. 1 and the description thereof is omitted.

Referring to FIG. 5, the differential amplifier circuit 200 has a first sense circuit 120 which includes a first positive amplifier a first negative amplifier 121, a second sense circuit 110 and a second negative amplifier 111, and a third sense circuit 130. The first positive amplifier 120 includes p MOS transistors and n MOS transistors. The p MOS transistors and n MOS transistors are connected to each other as shown in FIG. 5. The first positive amplifier 120 receives and differentially and positively amplifies the potential of the data line and the potential of the first reference REF1 line. Similarly to the first positive amplifier 120, the second positive amplifier 110 includes p MOS transistors and n MOS transistors. The p MOS transistors and n MOS transistors are connected to each other as shown in FIG. 5. The second positive amplifier 110 receives and differentially and positively amplifies the potential of the data line DL and the potential of the second reference REF2 line. The first negative amplifier 121 includes p MOS transistors and n MOS transistors. The p MOS transistors and n MOS transistors are connected to each other as shown in FIG. 5. The first negative amplifier 121 differentially and negatively amplifies the potential of the data line DL and the potential of the first reference REF1 line. The second negative amplifier 111 includes p MOS transistors and n MOS transistors. The p MOS transistors and n MOS transistors are connected to each other as shown in FIG. 5. The second negative amplifier 111 differentially and negative amplifies the potential of the data line DL and the potential of the second reference REF2 line. The third sense circuit 130 is a current mirror type amplifier which includes p MOS transistors and n MOS transistors as shown in FIG. 5. The third sense circuit 130 receives signals from the first and second positive amplifiers 120 and 110 and signals from the first and second negative amplifiers 121 and 111, and differentially amplifies those signals and outputs signals Vsa to an inverter 140.

When the potential of the data line DL is low, the first and second positive amplifiers 120 and 110 both output signals of high level to the third sense circuit 130, and the third sense circuit 130 outputs the signal Vsa of low level.

To the contrary, when the potential of the data line DL is high, the first and second positive amplifiers 120, 110 both output signals of low level to the third sense circuit 130, and the third sense circuit 130 outputs the signal Vsa of high level.

It is to be noted that while the preferred embodiment as described above relates to a sense amplifier circuit for a mask ROM, the present invention shall not be so limited and can be applied to a wide range of semiconductor memory devices wherein each memory cell includes one MOS transistor of such devices as EPROM and EEPROM devices.

As will be known to those skilled in the art from the above description, a sense amplifier circuit according to the present invention when applied in such semiconductor memory devices as a mask ROM, EPROM or EEPROM can provide a stable sense amplification operation even when the current characteristics of a "0" logic state (high threshold value) memory cell have deteriorated due to variations introduced in manufacture or rewriting.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A sense amplifier circuit for detecting whether a logic state of a detected memory cell including a transistor is "1" or "0" via a data line connected to the transistor, comprising:

a first dummy memory cell including a first transistor which has characteristics identical to the "1" logic state characteristics of the detected memory cell;

a second dummy memory cell including a second transistor which has characteristics identical to the "0" logic state characteristics of the detected memory cell;

a first reference line which is connected to the first dummy memory cell and to which is applied a reference potential of a level corresponding to the characteristics of the first transistor of the first dummy memory cell;

a second reference line which is connected to the second dummy memory cell and to which is applied a reference potential of a level corresponding to the characteristics of the second transistor of the second dummy memory cell; and a differential amplifier circuit which receives signals from the data line connected to the detected memory cell and the first and second reference lines as a differential input, and outputs either a high level or a low level according to the logic state of the detected memory cell based on the potential of the first or second reference line, the potential selected being that which differs from the potential of the data line.

2. The sense amplifier circuit according to claim 1, wherein the differential amplifier circuit includes first, second and third sense means, said first sense means comprising a first positive amplifier and a first negative amplifier, said first positive amplifier positively amplifying a first differential potential between the potential of the data line and the potential of the first reference line, and said first negative amplifier negatively amplifying the first differential potential between the potential of the data line and the potential of the first reference line, said second sense means comprising a second positive amplifier and a second negative amplifier, said second positive amplifier positively amplifying a second differential potential between the potential of the data line and the potential of the second reference line, said second negative amplifier negatively amplifying the second differential potential between the potential of the data line and the potential of the second reference line, and said third sense means receiving and differentially amplifying positively and negatively amplified signals from the first and second sense means.

* * * * *